United States Patent [19]

Fuhrman

[11] 4,122,404

[45] Oct. 24, 1978

[54] COMBINATION PHASE DETECTOR VOLTAGE DOUBLER AND LOW-PASS FILTER FOR USE ON A PHASE-LOCK LOOP

[75] Inventor: James L. Fuhrman, Cedar Rapids, Iowa

[73] Assignee: Rockwell International Corporation, El Segundo, Calif.

[21] Appl. No.: 871,655

[22] Filed: Jan. 23, 1978

[51] Int. Cl.² ............................................. H03B 3/04
[52] U.S. Cl. ................................... 331/1 A; 328/133; 328/155; 331/17; 331/27; 331/36 C; 331/116 R; 331/177 V
[58] Field of Search ..................... 331/1 A, 17, 25, 27; 307/232; 328/133, 134, 155

[56] References Cited

U.S. PATENT DOCUMENTS

| | | | |
|---|---|---|---|
| 3,609,408 | 9/1971 | Motisher et al. | 331/17 X |
| 4,055,814 | 10/1977 | Abraham et al. | 331/1 A |

Primary Examiner—Siegfried H. Grimm
Attorney, Agent, or Firm—Bruce C. Lutz; Howard R. Greenberg; H. Fredrick Hamann

[57] ABSTRACT

A phase detector circuit for use in a phase-lock loop is illustrated wherein a voltage pump is incorporated in the phase detector circuit so as to eliminate the utilization of a comparatively high voltage power supply which is normally required to sufficiently frequency modulate the variable frequency oscillator incorporated in most phase-lock loops.

8 Claims, 4 Drawing Figures

COMBINATION PHASE DETECTOR VOLTAGE DOUBLER AND LOW-PASS FILTER FOR USE ON A PHASE-LOCK LOOP

THE INVENTION

The present invention is generally related to electronics and more specifically related to a phase demodulating circuit which finds advantageous use in a phase-lock loop due to the high demodulated output voltage (approximately twice the supply voltage) which is available to drive the variable frequency oscillator portion of the loop.

In the prior art, it has been found that, in order to obtain sufficient frequency variation from a variable frequency oscillator in a phase-lock loop, the output voltage of the phase detector must be increased. To provide a concrete example it may be assumed that the input signals to a phase detector are both 5 volts peak amplitude. In the normal 90° phase relationship of the two input signals to the phase detector in a locked condition, the output voltage after filtering will be roughly 2 to 2.5 volts. If this signal is then used to drive a voltage variable capacitance diode, it will be found that there is not sufficient range in frequency to obtain a usably stable system. Thus, the normal practice has been to supply the output voltage of the phase detector to an isolation amplifier which is powered by, using the above voltages as an example, a 10 volt power supply so as to provide sufficient voltage ranges to the variable frequency oscillator. Since most of today's electronic circuitry can get by with only 5 volts, this necessitates the building of a separate 10 volt power supply for the sole purpose of providing power to the isolation amplifier.

The present invention uses a voltage pump to increase the voltage output of the phase detector to a value sufficient (close to 10 volts) to drive the voltage variable capacitance diode in a VXCO.

It is therefore an object of the present invention to provide an improved phase detector for use in low voltage circuitry and especially for use in a phase-lock loop portion of a system.

Other objects and advantages of the present invention may be ascertained from a reading of the specification and appended claims in conjunction with the drawings wherein:

DETAILED DESCRIPTION

Figure 1:
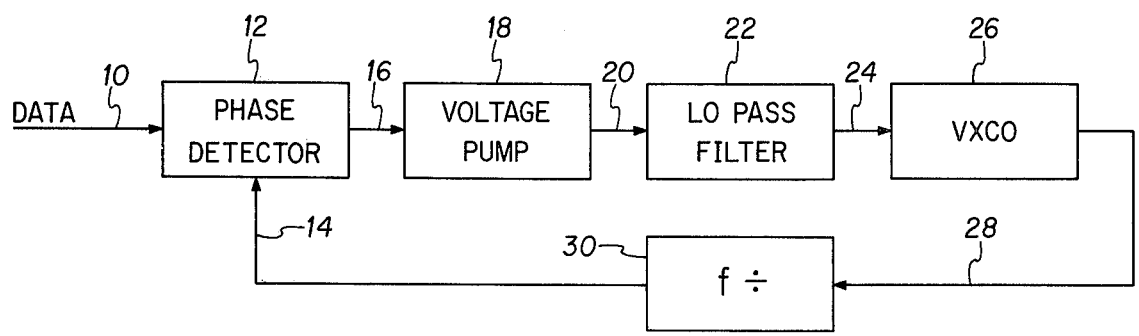
FIG. 1 is a symbolic block diagram of a phase-lock loop incorporating the present invention.

In FIG. 1, data is input on line 10 to a phase detector block 12 having a return frequency or clock signal incoming on line 14. An output of phase detector 12 appears on line 16 to a voltage pump 18 whose output appears on line 20 to a low-pass filter 22. A lead 24 connects low-pass filter 22 to a variable frequency oscillator 26 whose output is applied on a lead 28 to a frequency divider 30. Although the frequency divider 30 does not need to be part of a phase-lock loop, the higher frequencies present less stability problems and the overall circuit is cheaper and simpler using the voltage divider 30 than to use a lower frequency and normally less stable oscillator in the first place.

Figure 2:
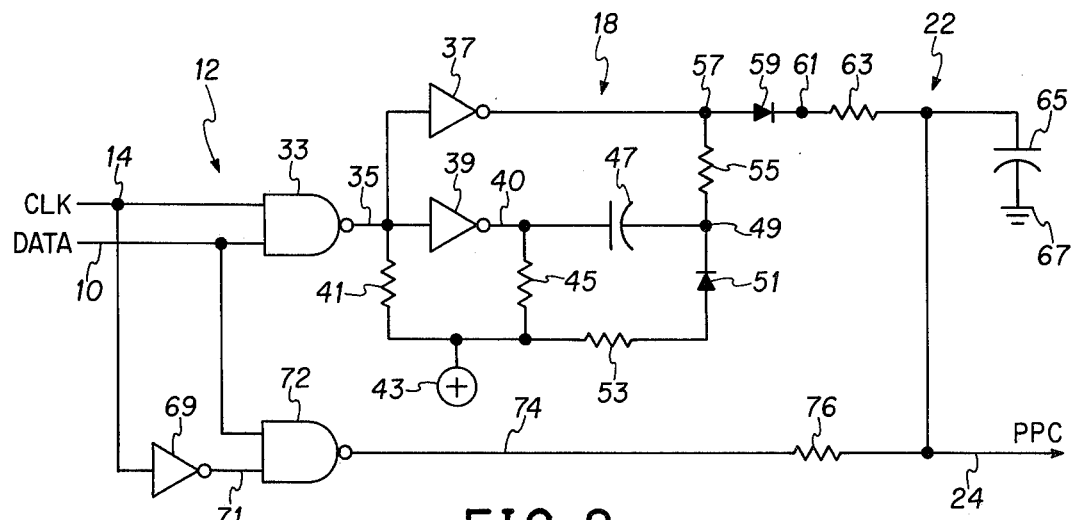
FIG. 2 is a detailed schematic diagram of the phase detector, voltage pump and low-pass filter of the block diagram of FIG. 1.

In FIG. 2, a line 10 is used to signify that it is basically the same as shown in FIG. 1. A lead 14 is shown for the clock lead so as to illustrate the input from the frequency divider 30. The output of FIG. 2 is labeled 24 to illustrate its relative position in FIG. 1. Although in FIG. 1 the blocks are shown in a simple series arrangement, the functions are intertwined in the actual circuit and thus can be designated only on a very general basis. Leap 10 is applied to one input of a NAND gate 33 whose other input is supplied from clock lead 14. An output of NAND gate 33 is supplied on lead 35 to one input of an inverter 37 and to an input of an inverter 39. The signals from lead 35 also are supplied through a resistor 41 to a positive voltage supply 43 which in the present invention is approximately 5 volts. An output of inverter 39 is supplied through a resistor 45 to power supply 43 and also through a capacitor 47 to a junction point 49. A diode 51 is connected through a resistor 53 to power supply 43. A resistor 55 is connected between junction point 49 and a junction point 57. Junction point 57 is connected to the output of inverter 37 and through a diode 59 to junction point 61. A resistor 63 is connected between junction point 61 and output 24 while a capacitor 65 is connected between output 24 and ground or reference potential 67. The input clock 14 is also connected through an inverter 69 and via a lead 71 to a NAND gate 72. A second input of NAND gate 72 is connected to the data lead 10. An output of NAND gate 72 is labeled 74 and is connected through a resistor 76 to output 24.

Figure 3:
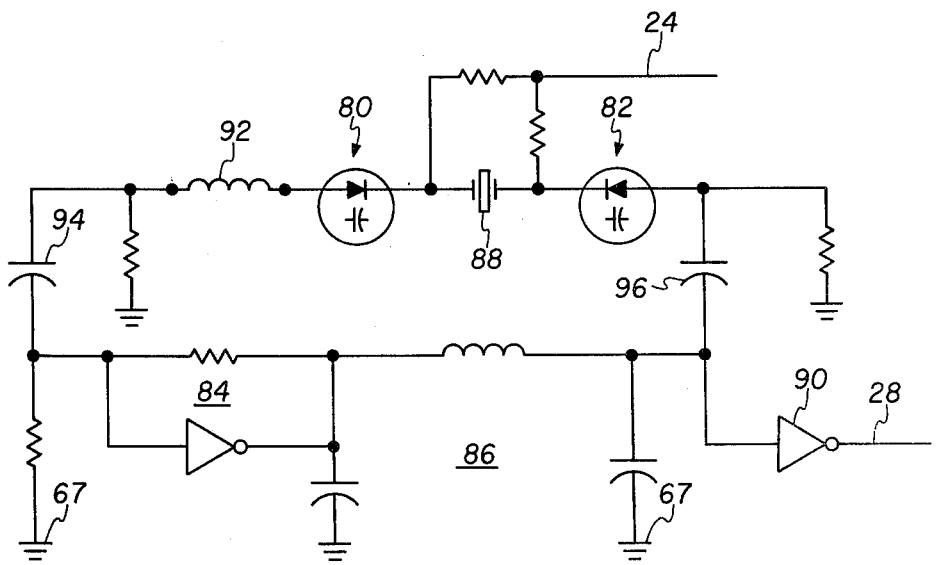
FIG. 3 is a detailed circuit diagram of the voltage variable oscillator of FIG. 1.

In FIG. 3, the detailed schematic is provided for completeness of disclosure. However, since voltage variable frequency oscillators are well-known in the art only a few brief remarks will be provided. The two diodes 80 and 82 are the voltage sensitive diodes and operate in conjunction with phase shifting networks 84 and 86 to appropriately react with the crystal 88. These signals are combined at the input to an inverting amplifier 90 used for isolation having an output on lead 28 which subsequently supplied signals to the frequency divider 30 of FIG. 1. The use of inductor 92 alters the effective capacitive change with voltage change of 80 in a manner opposite that of diode 82 so as to increase the effect on crystal 88 in a manner known to those skilled in the art. Capacitors 94 and 96 are used for D.C. isolation.

Figure 4:
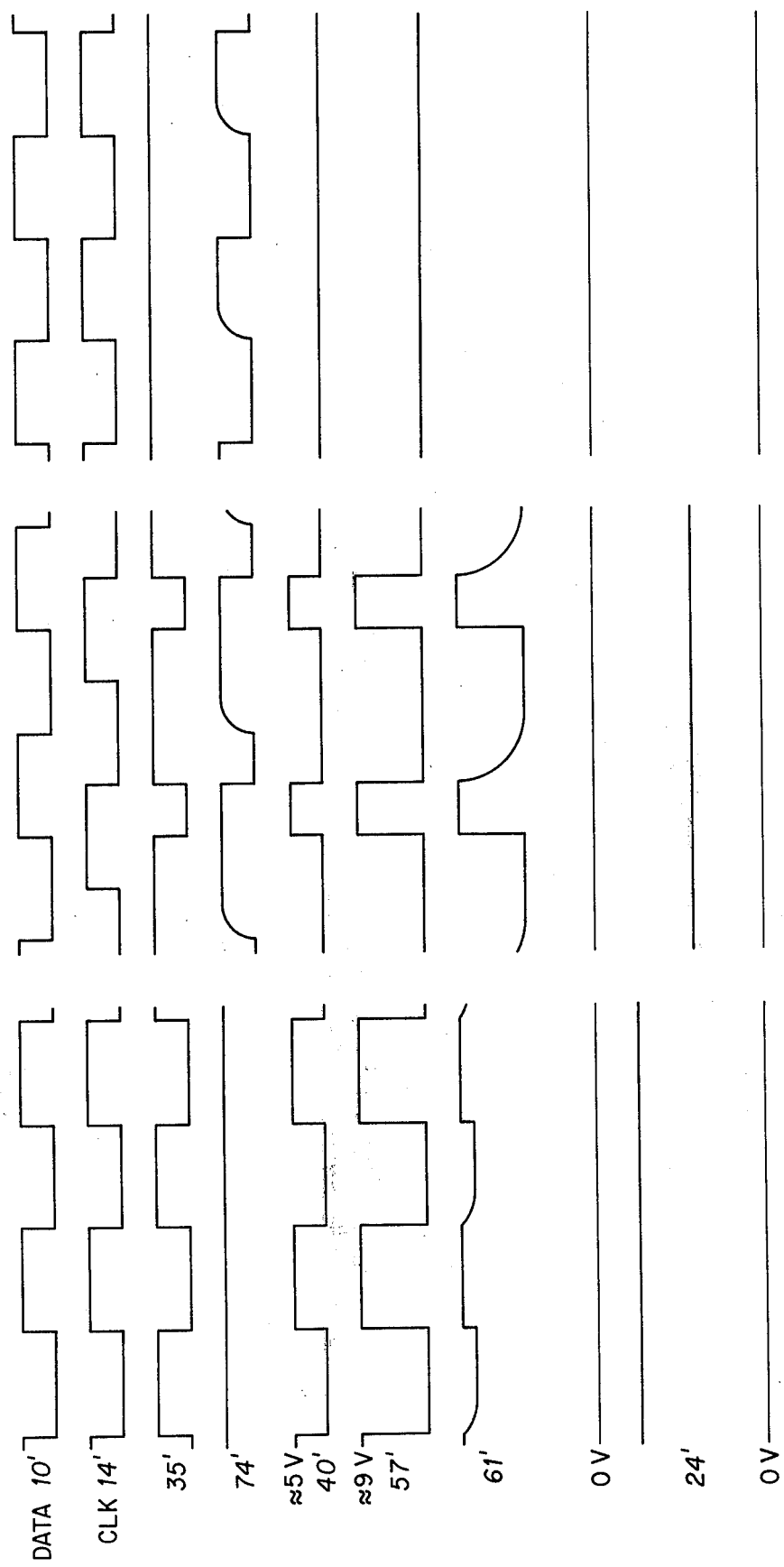
FIG. 4 illustrates waveforms used in describing the operation of the inventive concept.

In FIG. 4, data is illustrated as being input under several different conditions with respect to clock 14'. Each of the waveforms have a prime (') appended thereto to designate the waveforms relative to the respective points within the schematic of FIG. 2. It will be noted that the maximum voltage of waveform 40' is approximately 5 volts while the maximum voltage of waveform 57' is approximately 9 volts. All of the waveforms have a lowermost portion of reference potential or zero volts although this is specifically designated only with respect to waveforms 61' and 24' since there is no other easy reference for determining this output potential.

OPERATION

In operation the phase detector 12 takes the difference in phase between the inputs on leads 10 and 14 and provides an output on 16 which is indicative of the phase difference. If the two inputs are 180 electrical degrees out of phase, the output on lead 16 is a minimum value at substantially zero volts. On the other hand, if the two input signals are substantially identical in phase, the output on lead 16 is a maximum value. In view of the actual circuit design, there is really nothing in FIG. 2 which is directly indicative of lead 16 and thus the above references to the voltage on lead 16 is more symbolic than actuality. In any event, the voltage on lead 16 is then increased in value to approximately twice the incoming voltage by voltage pump 18 and then filtered in low-pass filter 22 so as to provide a relatively stable voltage for use in operating the voltage sensitive variable frequency oscillator 26. By using a high frequency oscillator for 26 and dividing this down with block 30 before returning it to the phase detector, an output voltage may be obtained from lead 14 which is very sharply defined and stable as compared to the ofttimes distorted input data on lead 10. As is known, a phase-lock loop may be used both for squaring-up data waveforms and for locking to the base frequency of a date-modulated pulse signal waveform. The present embodiment is used for both.

In FIG. 2 taken in conjunction with FIG. 4, it will be noted that the NAND gate 33 provides an output on 35 which provides a symmetrical waveform when the two inputs are exactly in phase and provides an output waveform which increases in DC average value as the two waveforms proceed towards the 180 electrical degrees out of phase condition. The NAND gate 72, since the clock input is inverted by inverter 69, produces the opposite results. It should be noted, however, that due to the action of stray capacitance, the output waveform is somewhat distorted as shown in waveform 74'. The maximum amplitude obtainable at the output of 74' is the value found in waveform 24'. The capacitor 47 in conjunction with diode 51 and resistor 53 provides a voltage pumping or voltage doubling action so that the voltage shown as waveform 40' is increased in maximum amplitude to approximately 9 volts whereas the voltage at lead 40 is approximately a maximum of 5 volts. The diode 59 then utilizes these peak voltages to charge capacitor 65 and the diode 59 prevents discharge of capacitor 65 when the output of inverter 37 is changed to a logic zero or reference potential output. As illustrated in waveform 24', the filtering action of capacitor 65 along with resistors 63 and 76 produces a relatively stable output voltage.

Although the oscillator of FIG. 3 was previously referred to as being fairly standard, it might be commented that the phase shifter 84 utilizes an active element in the form of a digital logic device while a second 180° phase shift is performed by the pi network 86. At the input to inverter 90, the signal is substantially a sine wave. The inverter 90 in one embodiment of the invention was actually two inverters in series for the purpose of squaring the waveform to have well-defined leading and trailing edges.

While a single embodiment of the invention has been disclosed as a preferred embodiment, it is to be realized that the phase detector can be designed in other ways while still falling within the scope of my inventive concept. Thus, I wish to be limited only by the scope of the appended claims.

I claim:

1. The method of increasing the phase detector output voltage in a phase-lock incorporating a phase detector, a filter and a voltage sensitive variable frequency oscillator in a feedback configuration comprising the steps of:
    pumping the peak-to-peak (p-p) voltage amplitude of the output signal from the phase detector to an increased value greater than the power supply voltage used by said detector; and
    controlling the oscillator with the increased signal.

2. Apparatus for providing sufficient control signal voltage to a variable frequency oscillator (VFO) from a phase detector while using a low voltage power source comprising, in combination:
    phase detector means including power input means and signal output means;
    power supply means, connected to said power input means of said phase detector means, for supplying power at a given low voltage thereto; and
    voltage pump means, connected to said signal output means of said phase detector means, for increasing the maximum amplitude of signals received therefrom to a value greater than said given low voltage for controlling a VFO.

3. Apparatus as claimed in claim 2 wherein said given voltage is 5 volts; and
    said VFO is a voltage variable capacitance crystal oscillator.

4. Apparatus as claimed in claim 2 comprising in addition:
    voltage sensitive variable frequency oscillator (VFO) means; and
    low-pass filter means connected between said pump means and said VFO for reducing short-term voltage variations in the pump output signal.

5. Apparatus comprising, in combination:
    first means for supplying a reference signal;
    second means for supplying an input signal;
    first NAND gate means connected to said first and second means for receiving signals therefrom;
    inverter means connected to said first means;
    second NAND gate means, connected to said inverter means and said second means, for receiving an inverted version of said reference signal and for receiving said input signal;
    voltage pump means for increasing the amplitude of signals applied thereto;
    low-pass filter means;
    apparatus output means; and
    means connecting said voltage pump means and said filter means between said apparatus output means and the outputs of said first and second NAND gate means.

6. Apparatus as claimed in claim 5 wherein said pump means comprises:
    first and second inverter means each having inputs connected to receive signals from said first NAND gate;
    power supply means connected to said inputs of said first and second inverter means, the potential of said power supply means determining the maximum available output potential from said first NAND gate;
    capacitor means and resistance means connected in series between outputs of said first and second inverter means;
    first unidirectional conduction means connected between said power supply means and a junction between said capacitor means and said resistance means; and second unidirectional conduction means, connected between the output of said first inverter means and the output of said pump means.

7. Apparatus as claimed in claim 6 wherein:
said pump means is a voltage doubler;
said power supply means supplies a potential of 5 volts; and the unidirectional means are diodes.

8. A parts efficient combination phase detector, voltage doubler and low-pass filter comprising, in combination:
first means for supplying a reference signal;
second means for supplying an input signal;
first NAND gate connected to said first and second means for receiving signals therefrom;
second NAND gate, connected to said first and second means, for logically NANDing a "not" version of said reference signal and said input signal;
first and second inverter means each having inputs connected to receive signals from said first NAND gate;
power supply means connected to said inputs of said first and second inverter means, the potential of said power supply means determining the maximum available output potential from said first NAND gate;
first capacitance means and resistance means connected in series between outputs of said first and second inverter means;
first unidirectional conduction means connected between said power supply means and a junction between said first capacitance means and said resistance means;
reference potential means;
second unidirectional conduction means connected between the output of said first inverter means and the output of said second NAND gate means;
second capacitance connected between said second unidirectional conduction means and said reference potential means; and
apparatus output means connected in parallel with said second capacitance means.

* * * * *

UNITED STATES PATENT AND TRADEMARK OFFICE
CERTIFICATE OF CORRECTION

PATENT NO. : 4,122,404
DATED : October 24, 1978
INVENTOR(S) : James L. Fuhrman

It is certified that error appears in the above-identified patent and that said Letters Patent are hereby corrected as shown below:

IN THE SPECIFICATION:

Column 2, Line 12, delete "Leap" and substitute therefor --Lead--.

Signed and Sealed this

Third Day of April 1979

[SEAL]

Attest:

RUTH C. MASON
Attesting Officer

DONALD W. BANNER
Commissioner of Patents and Trademarks